United States Patent
Hayashi et al.

(10) Patent No.: US 10,985,094 B2
(45) Date of Patent: Apr. 20, 2021

(54) LEAD FRAME AND METHOD OF MANUFACTURING LEAD FRAME

(71) Applicant: SHINKO ELECTRIC INDUSTRIES CO., LTD., Nagano (JP)

(72) Inventors: Shintaro Hayashi, Nagano (JP); Hajime Koike, Nagano (JP); Konosuke Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/571,304

(22) Filed: Sep. 16, 2019

(65) Prior Publication Data
US 2020/0098672 A1    Mar. 26, 2020

(30) Foreign Application Priority Data

Sep. 21, 2018    (JP) ............................. JP2018-177871

(51) Int. Cl.
*H01L 23/495*    (2006.01)
*H01L 21/48*    (2006.01)
*H01L 23/00*    (2006.01)

(52) U.S. Cl.
CPC .... *H01L 23/49565* (2013.01); *H01L 21/4828* (2013.01); *H01L 21/4842* (2013.01); *H01L 23/4951* (2013.01); *H01L 23/49503* (2013.01); *H01L 23/49548* (2013.01); *H01L 24/16* (2013.01); *H01L 24/48* (2013.01); *H01L 2224/16245* (2013.01); *H01L 2224/48175* (2013.01)

(58) Field of Classification Search
CPC combination set(s) only.
See application file for complete search history.

(56) References Cited

U.S. PATENT DOCUMENTS

2014/0319663 A1* 10/2014 Shibasaki ............... H01L 24/85
257/670

FOREIGN PATENT DOCUMENTS

JP    2015-072946    4/2015

* cited by examiner

*Primary Examiner* — Ratisha Mehta
(74) *Attorney, Agent, or Firm* — Rankin, Hill & Clark LLP

(57) ABSTRACT

A lead frame includes a lead portion having a first surface and a second surface, a connecting bar that has a first surface and a second surface and to which the lead portion is connected, and a raised portion provided on the first surface of the connecting bar. The first surface of the connecting bar is positioned between the first and the second surfaces of the lead portion. The tip of the raised portion is positioned between the first surface of the lead portion and the first surface of the connecting bar.

8 Claims, 21 Drawing Sheets

LEAD FRAME AND METHOD OF MANUFACTURING LEAD FRAME

CROSS-REFERENCE TO RELATED APPLICATION

This application is based upon and claims the benefit of priority of the prior Japanese Patent Application No. 2018-177871, filed on Sep. 21, 2018, the entire contents of which are incorporated herein by reference.

FIELD

The embodiments discussed herein are related to a lead frame and a method of manufacturing the lead frame.

BACKGROUND

Quad flat no-leads (QFN) packaging is known as a semiconductor packaging technology that offers thin profile to semiconductor devices. A QFN package semiconductor device includes a semiconductor element that is mounted on a mount surface of a lead frame and encapsulated with encapsulation resin. Lead portions of the semiconductor device are partially exposed from a back surface opposite to the mount surface.

The process of manufacturing such QFN package semiconductor devices starts with etching on a metal plate to produce a lead frame. The lead frame includes regions corresponding to respective semiconductor elements arranged in a matrix. The regions of the lead frame corresponding to the semiconductor elements are defined by connecting bars, to which a plurality of lead portions disposed around the semiconductor elements are connected. The subsequent process of manufacturing the QFN package semiconductor devices is molding, in which the semiconductor elements are encapsulated with encapsulation resin.

After molding, the next process of manufacturing the QFN package semiconductor devices is sawing, in which the encapsulation resin and the connecting bars are cut off with a saw blade to separate the semiconductor elements into individual semiconductor devices. After the sawing process, in some cases, metal burrs remain on the cross sections of the lead portions cut off from the connecting bars. Metal burrs are unwanted pieces since they may cause a short circuit between the adjacent lead portions. To prevent such metal burrs remaining on the connecting bars, half-etched recessed portions are provided to the connecting bars. However, providing half-etched recessed portions to the connecting bars reduces the stiffness of the connecting bars. Reduced stiffness may lead to deformation of the connecting bars.

Japanese Patent Application Laid-open No. 2015-072946 discloses a technique of leaving a non-half-etched portion on a back surface of the connecting bar opposite to the mount surface.

In the process of manufacturing the QFN package semiconductor devices, in some cases, molding is followed by external plating process. In the external plating process, an external plating layer such as a solder-plating layer is deposited on the portions exposed from the encapsulation resin on the back surface of the lead frame. For example, external terminals of the lead portions are exposed from the encapsulation resin, and the solder-plating layer is deposited on the external terminals of the lead portions.

If the non-half-etched portions are left on the back surface of the connecting bars as disclosed in Japanese Patent Application Laid-open No. 2015-072946, the non-half-etched portions are exposed from the encapsulation resin on the back surface of the lead frame since the non-half-etched portions are coplanar with the external terminals of the lead portions. If the external plating process is performed, a solder-plating layer is deposited on the non-half-etched portions on the back surface of the connecting bar. In the sawing process that follows, the connecting bar and the solder-plating layer are cut off with a saw blade, and the solder-plating layer may adhere to the edges of the saw blade and the saw blade may become dull.

SUMMARY

According to an aspect of an embodiment, a lead frame includes a lead portion having a first surface and a second surface; a connecting bar that has a first surface and a second surface and to which the lead portion is connected; and a raised portion provided on the first surface of the connecting bar, wherein the first surface of the connecting bar is positioned between the first surface and the second surface of the lead portion, and the raised portion has a tip that is positioned between the first surface of the lead portion and the first surface of the connecting bar.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The following describes embodiments of a lead frame and a method of manufacturing the lead frame according to the present disclosure with reference to the accompanying drawings. The embodiments are not intended to limit the scope of the present disclosure. In the embodiments below, components having similar functions are similarly numbered and the descriptions thereof are not repeated.

First Embodiment

Configuration of Lead Frame

Figure 1:
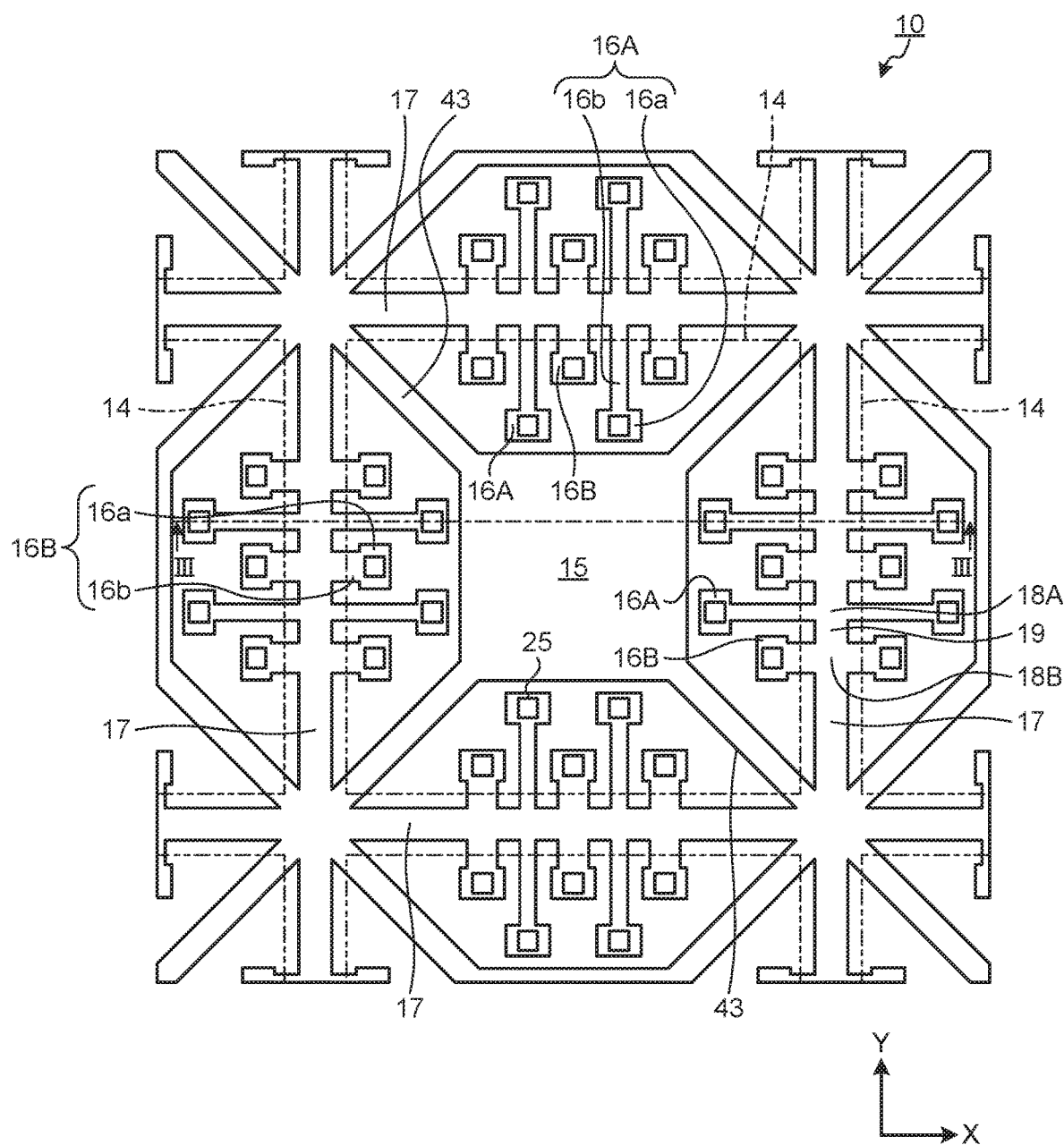
FIG. 1 is a plan view of a top surface of a lead frame according to a first embodiment of the present disclosure.
Figure 2:
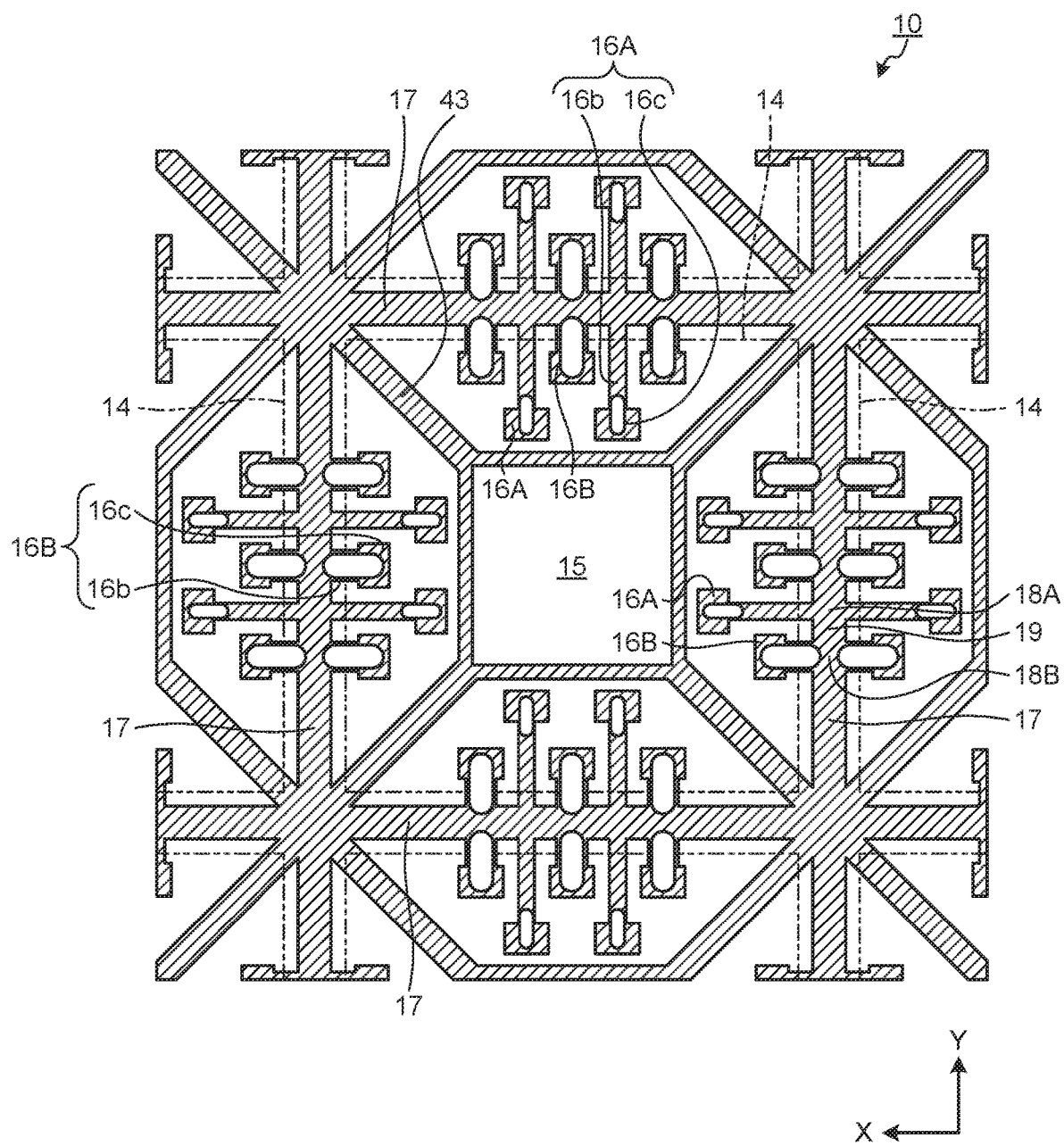
FIG. 2 is a plan view of a back surface of the lead frame according to the first embodiment.
Figure 3:
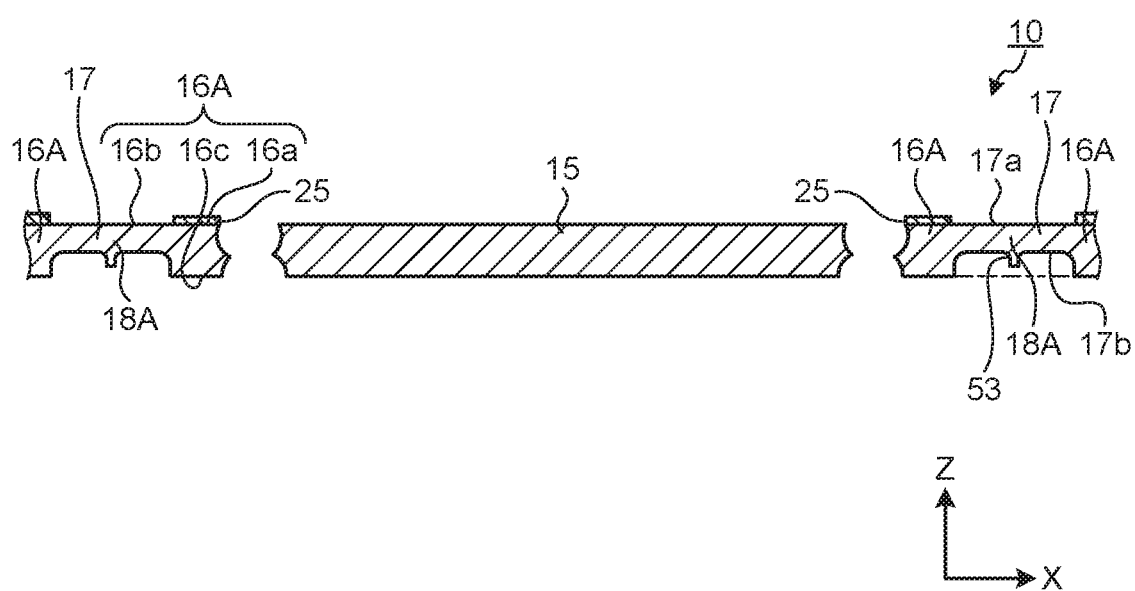
FIG. 3 is a sectional view taken along line III-III in FIG. 1.

FIG. 1 is a plan view of a top surface of a lead frame 10 according to a first embodiment of the present disclosure. FIG. 2 is a plan view of a back surface of the lead frame 10 according to the first embodiment. FIG. 3 is a sectional view taken along line III-III in FIG. 1. In the following description, a "top surface" refers to a surface located at the same side as a mount surface on which a semiconductor element 21, which will be described later, is mounted, and a "back surface" refers to a surface located at the opposite side of the mount surface on which the semiconductor element 21 is mounted. In FIG. 2, half-etched portions are hatched with lines.

As illustrated in FIGS. 1 to 3, the lead frame 10 is a frame for use in producing semiconductor devices 20, which will be described later. The lead frame 10 includes a plurality of lead frame elements 14 arranged in a matrix in an X direction and a Y direction.

The lead frame elements 14 correspond to regions of the individual semiconductor devices 20. Each lead frame element 14 includes a die pad 15, and a plurality of long lead portions 16A and a plurality of short lead portions 16B that are disposed around the die pad 15. In FIGS. 1 and 2, regions surrounded by the dashed-two-dotted line correspond to the respective lead frame elements 14. The long lead portions 16A and the short lead portions 16B are examples of the lead portion.

The die pad 15 has a mount surface on which a semiconductor element 21 is mounted and has a generally rectangular shape when seen in the plan view. The long lead portions 16A and the short lead portions 16B are terminals connected to the semiconductor element 21 via bonding wires 22, which will be described later, and are spaced apart from the die pad 15.

As illustrated in FIGS. 1 and 2, the long lead portions 16A and the short lead portions 16B extend in the X direction or the Y direction. The long lead portions 16A are longer than the short lead portions 16B. The long lead portions 16A and the short lead portions 16B are alternately disposed around the die pad 15.

The long lead portions 16A and the short lead portions 16B each have a relatively wide internal terminal 16a to which a bonding wire 22 is connected and a relatively narrow connecting portion 16b. The internal terminal 16a is disposed on the top surface of the long lead portions 16A and the short lead portions 16B. On the internal terminal 16a, a plated portion 25 is formed to enhance adhesion to the bonding wire 22. On the back surface of the long lead portions 16A and the short lead portions 16B, an external terminal 16c (see FIG. 3) connected to an external circuit board (not illustrated) is provided. In other words, internal terminals 16a on the top surface of the long lead portions 16A and the short lead portions 16B are disposed in a staggered manner (see FIG. 1) and external terminals 16c on the back surface are disposed in a staggered manner (see FIG. 2). The external terminals 16c of the long lead portions 16A and the short lead portions 16B are exposed from encapsulation resin on the back surface of the lead frame 10 after molding, in which the semiconductor elements 21 are encapsulated with the encapsulation resin.

A plurality of connecting bars 17 are arranged in a grid to surround each of the lead frame elements 14. The die pad 15 of the lead frame element 14 is connected to connecting bars 17 via four hanging leads 43 extending from the corners of the die pad 15.

Each connecting bar 17 is disposed between adjacent lead frame elements 14 and extends in a direction orthogonal to the longitudinal direction of the long lead portions 16A and the short lead portions 16B to connect a corresponding pair of long lead portions 16A and a corresponding pair of short lead portions 16B. For example, to a connecting bar 17 extending in the Y direction, a plurality of long lead portions 16A and a plurality of short lead portions 16B extending in the X direction are connected. The corresponding pair of long lead portions 16A (short lead portions 16B) are an adjacent pair of the long lead portions 16A (short lead portions 16B) aligned in the longitudinal direction of the long lead portions 16A (short lead portions 16B) via a connecting bar 17. In FIG. 3, for example, the corresponding pair of long lead portions 16A are a pair of long lead portions 16A adjacent to each other in the X direction via a connecting bar 17.

As illustrated in FIGS. 1 and 2, the connecting bars 17 each have a plurality of long lead joints 18A, a plurality of short lead joints 18B, and a plurality of middle portions 19.

Each long lead joint 18A is disposed between a corresponding pair of long lead portions 16A, and each short lead joint 18B is disposed between a corresponding pair of short lead portions 16B. In FIG. 3, for example, the long lead joint 18A is disposed between a pair of long lead portions 16A aligned in the X direction. Each middle portion 19 is disposed between a long lead joint 18A and a short lead joint 18B adjacent to each other. In other words, the long lead joints 18A, the middle portions 19, and the short lead joints 18B are disposed in the longitudinal direction of the connecting bar 17 in the order of a long lead joint 18A, a middle portion 19, a short lead joint 18B, a middle portion 19, and a long lead joint 18A, which are repeated as appropriate.

Figure 4A:
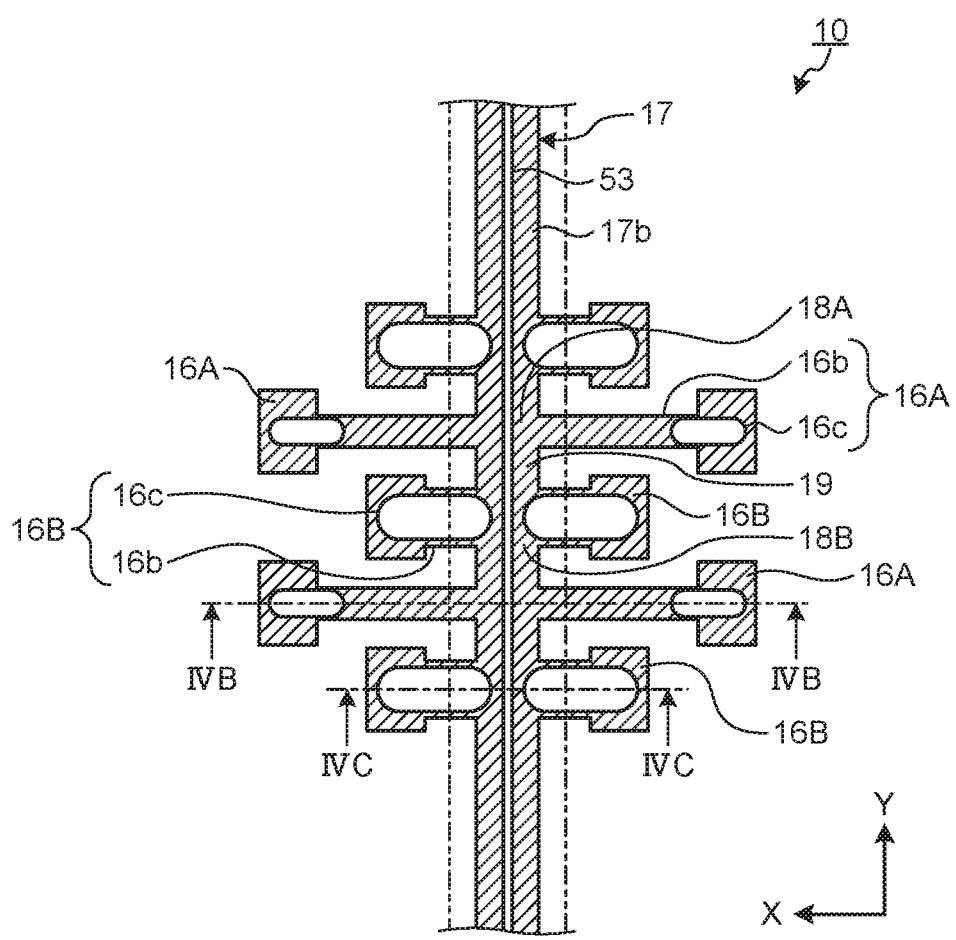
FIG. 4A is a partially enlarged plan view of a back surface of a connecting bar according to the first embodiment.
Figure 4B:
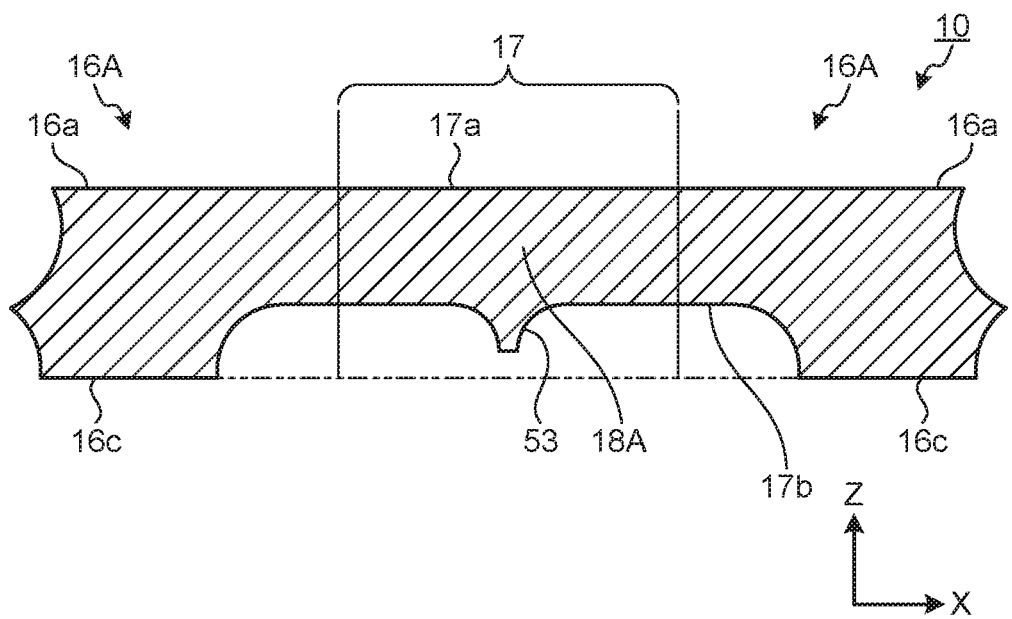
FIG. 4B is a sectional view of a long lead joint of the connecting bar according to the first embodiment.
Figure 4C:
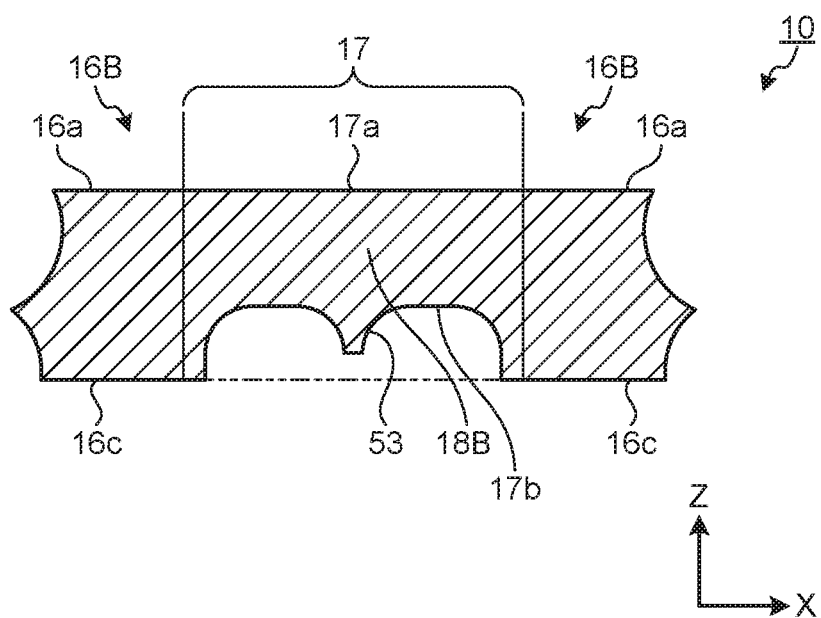
FIG. 4C is a sectional view of a short lead joint of the connecting bar according to the first embodiment.

FIG. 4A is a partially enlarged plan view of a back surface of a connecting bar 17 according to the first embodiment. FIG. 4B is a sectional view of a long lead joint 18A of the connecting bar 17 according to the first embodiment. FIG. 4C is a sectional view of a short lead joint 18B of the connecting bar 17 according to the first embodiment. FIG. 4B corresponds to a sectional view taken along line IVB-IVB in FIG. 4A and FIG. 4C corresponds to a sectional view taken along line IVC-IVC in FIG. 4A.

As illustrated in FIGS. 4B and 4C, the connecting bar 17 has a top surface 17a located at the same side as the mount surface of the die pad 15 and a back surface 17b located at the opposite side of the mount surface of the die pad 15. The back surface 17b of the connecting bar 17 corresponds to a bottom surface of a recessed portion formed by half-etching on the back surface of the lead frame 10.

As illustrated in FIGS. 4B and 4C, the back surface 17b of the connecting bar 17 is positioned between the top surface (specifically, the surface on which the internal terminal 16a is disposed) and the back surface (specifically, the surface on which the external terminal 16c is disposed) of the long lead portions 16A and the short lead portions 16B.

The back surface 17b of the connecting bar 17 has a raised portion 53. The raised portion 53 is raised from the back surface 17b of the connecting bar 17 to a position not reaching a plane coplanar with the back surface (specifically, the surface on which the external terminal 16c is disposed) of the long lead portions 16A or the short lead portions 16B. The tip of the raised portion 53 is positioned between the back surface (specifically, the surface on which the external terminal 16c is disposed) of the long lead portions 16A and the short lead portions 16B and the back surface 17b of the connecting bar 17. In other words, the tip of the raised portion 53 is recessed from a plane coplanar with the back surface (specifically, the surface on which the external terminal 16c is disposed) of the long lead portions 16A and the short lead portions 16B toward the back surface 17b of the connecting bar 17.

As illustrated in FIG. 4A, the raised portion 53 linearly extends in a direction in which the connecting bar 17 extends. In other words, as illustrated in FIGS. 4B and 4C, the raised portion 53 is formed at regions corresponding to the long lead joints 18A and the short lead joints 18B on the back surface 17b of the connecting bar 17.

In the process of manufacturing the QFN package semiconductor devices 20, molding is, in some cases, followed by solder plating process, in which a solder-plating layer is deposited on the portions exposed from the encapsulation resin on the back surface of the lead frame 10. For example, since the external terminals 16c of the long lead portions 16A and the short lead portions 16B are exposed from the encapsulation resin, the external plating process, if performed, forms the solder-plating layer on the external terminals 16c of the long lead portions 16A and the short lead portions 16B.

Suppose that, as disclosed in Japanese Patent Application Laid-open No. 2015-072946, a non-half-etched portion is left on the back surface 17b of the connecting bar 17. This non-half-etched portion is coplanar with the external terminals 16c of the long lead portions 16A and the short lead portions 16B, and is exposed from the encapsulation resin on the back surface of the lead frame 10. When the external plating process is performed, a solder-plating layer is deposited on the non-half-etched portion on the back surface 17b of the connecting bar 17. In the sawing process that follows, the connecting bar 17 and the solder-plating layer are cut off with a saw blade, and the solder-plating layer may adhere to the edges of the saw blade and the saw blade may become dull.

To prevent this, as illustrated in FIGS. 3, 4B, and 4C, the lead frame 10 is provided with the raised portion 53 on the back surface 17b of the connecting bar 17 such that the tip of the raised portion 53 is positioned between the back surface of the long lead portions 16A and the short lead portions 16B and the back surface 17b of the connecting bar 17. With this structure, the sawing process on the lead frame 10 can be achieved without adhesion of machining dust to the saw blade.

In other words, the tip of the raised portion 53 is recessed from a plane coplanar with the back surface (specifically, the surface on which the external terminal 16c is disposed) of the long lead portions 16A and the short lead portions 16B toward the back surface 17b of the connecting bar 17. The raised portion 53, therefore, is not exposed from the encapsulation resin on the back surface of the lead frame 10 and the solder-plating layer is not formed on the raised portion 53 after the external plating process. This configuration can prevent adhesion of the solder-plating layer to the edges of the saw blade when the connecting bar 17 is cut off in the sawing process. In this regard, the sawing process on the lead frame 10 can be achieved without adhesion of machining dust to the saw blade. In addition, although the connecting bar 17 has a half-etched back surface 17b, the raised portion 53 provides a certain thickness to the connecting bar 17 and can keep the stiffness of the connecting bar 17. Providing the raised portion 53 as described above can keep the stiffness of the connecting bar 17 and can prevent adhesion of machining dust to the saw blade in the sawing process.

Configuration of Semiconductor Device

Figure 5:
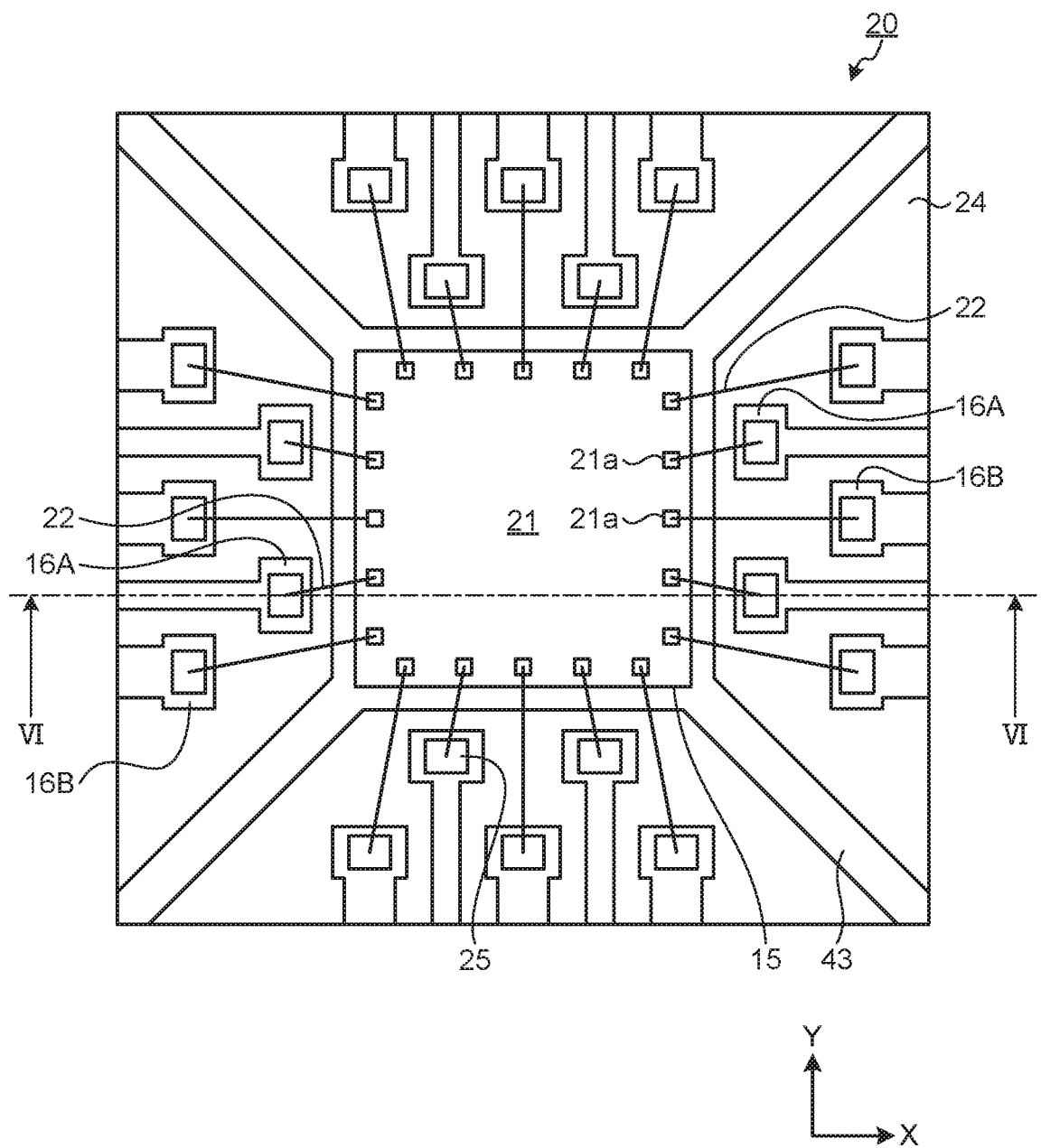
FIG. 5 is a plan view of a top surface of a semiconductor device made with the lead frame according to the first embodiment.
Figure 6:
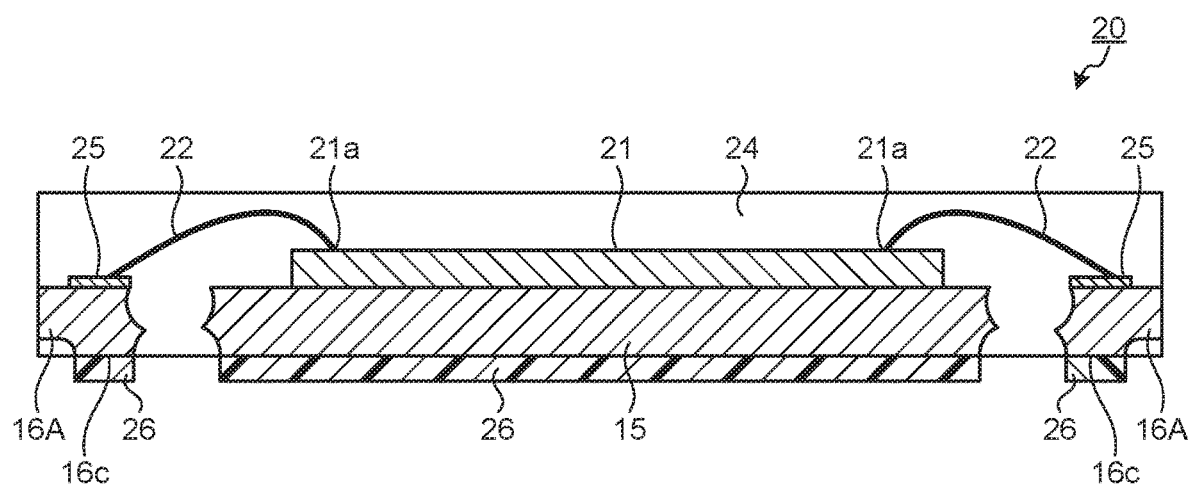
FIG. 6 is a sectional view taken along line VI-VI in FIG. 5.
Figure 6:
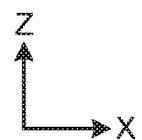

Described next is a semiconductor device 20 made with the lead frame 10 according to the first embodiment with reference to FIGS. 5 and 6. FIG. 5 is a plan view of a top surface of the semiconductor device 20 made with the lead frame 10 according to the first embodiment. FIG. 6 is a sectional view taken along line VI-VI in FIG. 5.

The semiconductor device 20 illustrated in FIGS. 5 and 6 includes the die pad 15, the long lead portions 16A, the short lead portions 16B, and the semiconductor element 21 mounted on the mount surface of the die pad 15. The semiconductor device 20 includes the bonding wires 22 that electrically connect the long lead portions 16A and the short lead portions 16B with terminals 21a on the semiconductor element 21. The die pad 15, the long lead portions 16A, the short lead portions 16B, the semiconductor element 21, and the bonding wires 22 are encapsulated with encapsulation resin 24.

The semiconductor element 21 is, for example, an integrated circuit, a large-scale integrated circuit, a transistor, a thyristor, or a diode. The semiconductor element 21 is fixed on the mount surface of the die pad 15 with fixing material such as die bonding paste. If the fixing material is die bonding paste, die bonding paste made of, for example, epoxy resin or silicone resin can be used.

The bonding wires 22 are made of conductive material such as gold or copper, and ends of the bonding wires 22 are connected to the terminals 21a on the semiconductor element 21 and the other ends are connected to the long lead portions 16A and the short lead portions 16B.

The encapsulation resin 24 may be, for example, epoxy resin or silicone resin. The external terminals 16c of the long lead portions 16A and the short lead portions 16B are exposed from the encapsulation resin 24 on the back surface of the semiconductor device 20. The external terminals 16c of the long lead portions 16A and the short lead portions 16B are covered with a solder-plating layer 26 that is the external layer of the semiconductor device 20. The back surface of the die pad 15 opposite to the mount surface is also exposed from the encapsulation resin 24 and covered with the solder-plating layer 26.

Method of Manufacturing Lead Frame

Described next is a method of manufacturing the lead frame 10 illustrated in FIGS. 1 to 3, 4A, and 4B with reference to FIGS. 7A to 7H. FIGS. 7A to 7H are sectional views illustrating the method of manufacturing the lead frame 10 according to the first embodiment. The sectional view illustrated in FIGS. 7A to 7H correspond to FIG. 3.

Figure 7A:
FIG. 7A is a sectional view illustrating a method of manufacturing the lead frame according to the first embodiment.

First, as illustrated in FIG. 7A, a flat metal plate 31 is prepared. The metal plate 31 may be made of metal comprising, for example, copper.

Figure 7B:
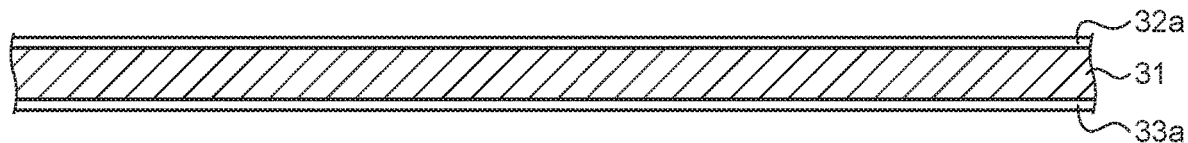
FIG. 7B is a sectional view illustrating the method of manufacturing the lead frame according to the first embodiment.

As illustrated in FIG. 7B, photoresists 32a and 33a are applied to all over the top surface and the back surface of the metal plate 31, and are dried.

Figure 7C:
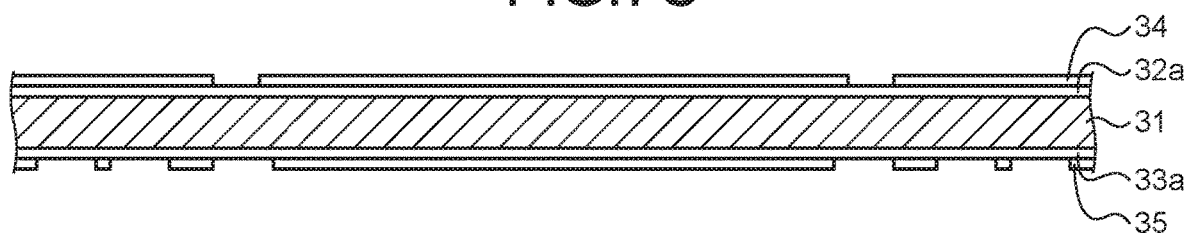
FIG. 7C is a sectional view illustrating the method of manufacturing the lead frame according to the first embodiment.

As illustrated in FIG. 7C, the photoresists 32a and 33a are exposed using photo masks 34 and 35 having a certain pattern.

Figure 7D:
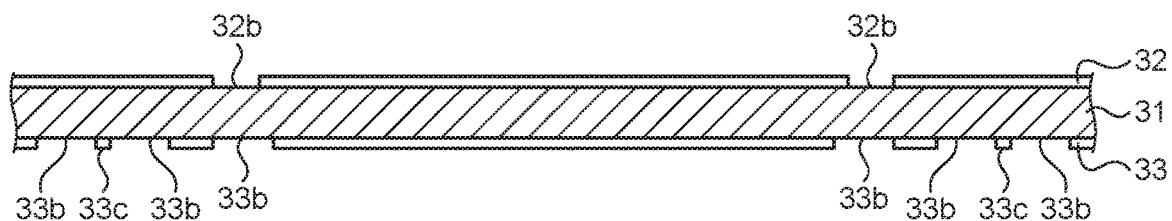
FIG. 7D is a sectional view illustrating the method of manufacturing the lead frame according to the first embodiment.

As illustrated in FIG. 7D, the exposed photoresists 32a and 33a are developed, and resist layers 32 and 33 having certain apertures are formed. Specifically, the development process forms apertures 32b on the top surface of the metal plate 31 at regions to be etched through the metal plate 31. The development process also forms apertures 33b on the back surface of the metal plate 31 at regions to be etched through the metal plate 31 and regions to be half-etched. The apertures 33b are formed on the back surface of the metal plate 31 such that a partial resist 33c is left on a region corresponding to the raised portion 53 of the connecting bar 17 to inhibit the corrosion process on the metal plate 31 by etching solution.

Figure 7E:
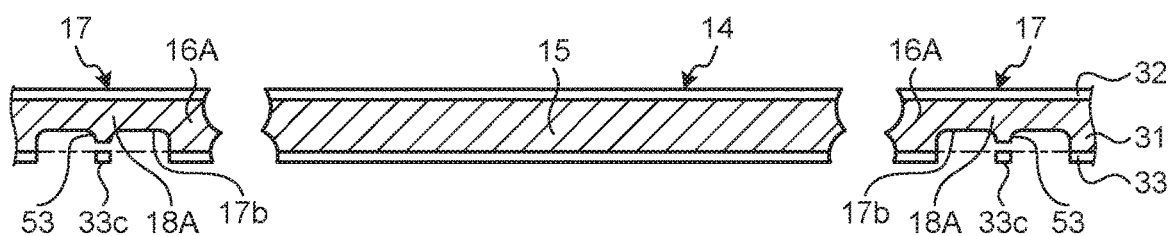
FIG. 7E is a sectional view illustrating the method of manufacturing the lead frame according to the first embodiment.

As illustrated in FIG. 7E, the metal plate 31 is etched with the etching solution with the resist layers 32 and 33 being used as masks (corrosion-resistant masks). The etching solution may be selected as appropriate in accordance with the material of the metal plate 31 to be used. For example, if the metal plate 31 is made of copper, a solution of ferric chloride is used. In etching the metal plate 31, for example, the etching solution is sprayed onto the top surface and the back surface of the metal plate 31. This etching process forms a plurality of lead frame elements 14 in the metal plate 31 each including a die pad 15 having a mount surface on which a semiconductor element 21 is mounted and a plurality of long lead portions 16A and a plurality of short lead portions 16B disposed around the die pad 15. In forming the lead frame elements 14, the connecting bars 17 each having the long lead joints 18A, the short lead joints 18B, and the middle portions 19 are formed at the respective positions between adjacent lead frame elements 14. In forming the lead frame elements 14, the back surface 17b of the connecting bars 17 is formed such that it is positioned between the top surface and the back surface of the long lead portions 16A and the short lead portions 16B. In forming the lead frame elements 14, the etching solution flows into the apertures 33b disposed at either side of the partial resist 33c and corrodes the metal plate 31. This process forms the raised portion 53 on the back surface 17b of the connecting bars 17 with the tip of the raised portion 53 being positioned between the back surface of the long lead portions 16A and the short lead portion 16B and the back surface 17b of the connecting bars 17.

Figure 7F:
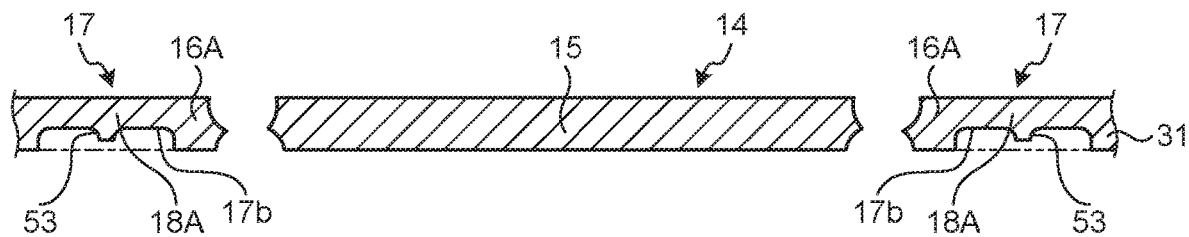
FIG. 7F is a sectional view illustrating the method of manufacturing the lead frame according to the first embodiment.

As illustrated in FIG. 7F, the resist layers 32 and 33 are stripped and removed.

Figure 7G:
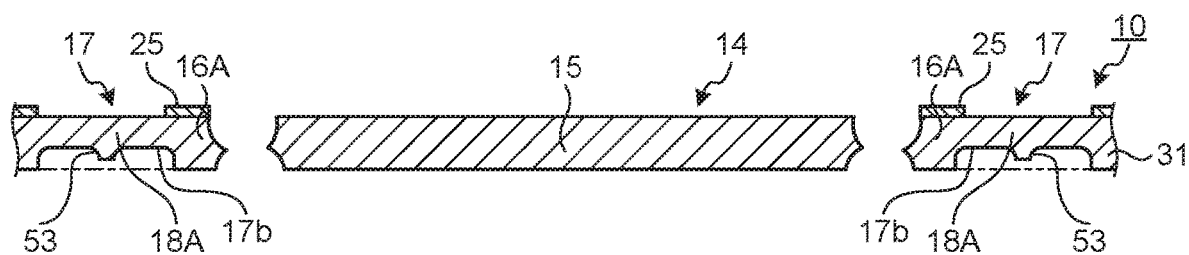
FIG. 7G is a sectional view illustrating the method of manufacturing the lead frame according to the first embodiment.

As illustrated in FIG. 7G, the internal terminals 16a of the long lead portions 16A and the short lead portions 16B are plated (e.g., electroplated), whereby plated portion 25 are formed. The plated portion 25 may be any type of plating that can provide adhesion to the bonding wires 22. The plated portion 25 may be single-layer plating of, for example, Ag or Au, or multi-layer plating in which Ni and Pd, or Ni, Pd, and Au are deposited in this order. The plated portion 25 may be formed only on portions in contact with the bonding wires 22 on the internal terminals 16a, or may be formed on all over the lead frame 10. The lead frame 10 according to the first embodiment is manufactured in this manner.

Figure 7H:
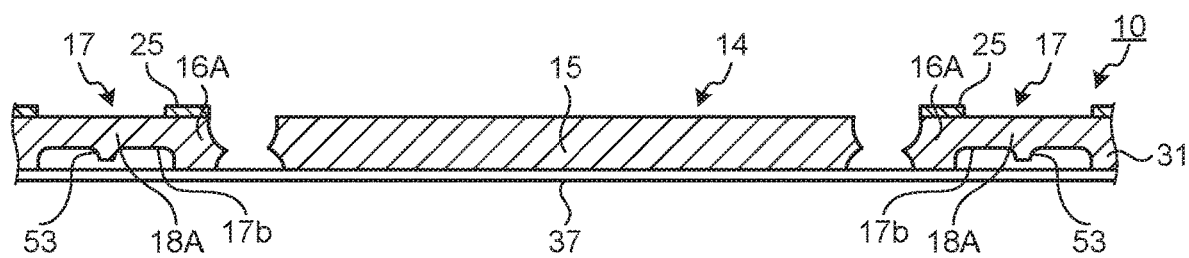
FIG. 7H is a sectional view illustrating the method of manufacturing the lead frame according to the first embodiment.

As illustrated in FIG. 7H, the lead frame 10 is placed on a back tape 37 and fixed thereto.

Method of Manufacturing Semiconductor Device

Described next is a method of manufacturing the semiconductor device 20 illustrated in FIGS. 5 and 6 with reference to FIGS. 8A to 8H. FIGS. 8A to 8H are sectional views illustrating the method of manufacturing the semiconductor device 20 according to the first embodiment. The sectional views illustrated in FIGS. 8A to 8H correspond to FIG. 6.

Figure 8A:
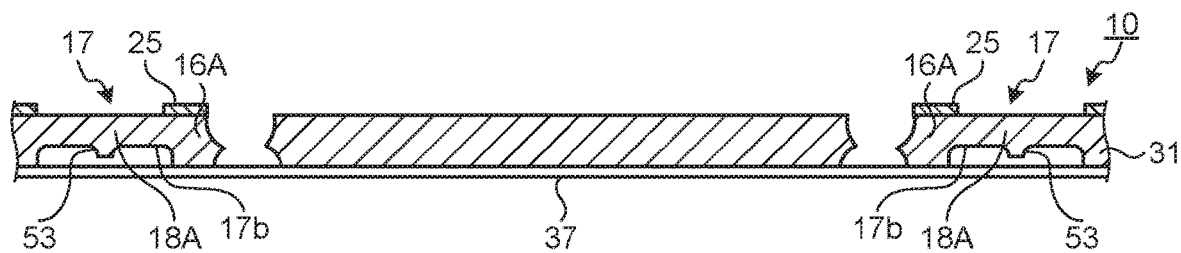
FIG. 8A is a sectional view illustrating a method of manufacturing the semiconductor device according to the first embodiment.

First, as illustrated in FIG. 8A, a lead frame 10 including a die pad 15 and a plurality of long lead portions 16A and a plurality of short lead portions 16B disposed around the die pad 15 is produced. The lead frame 10 is produced in accordance with the processes illustrated in FIGS. 7A to 7H.

Figure 8B:
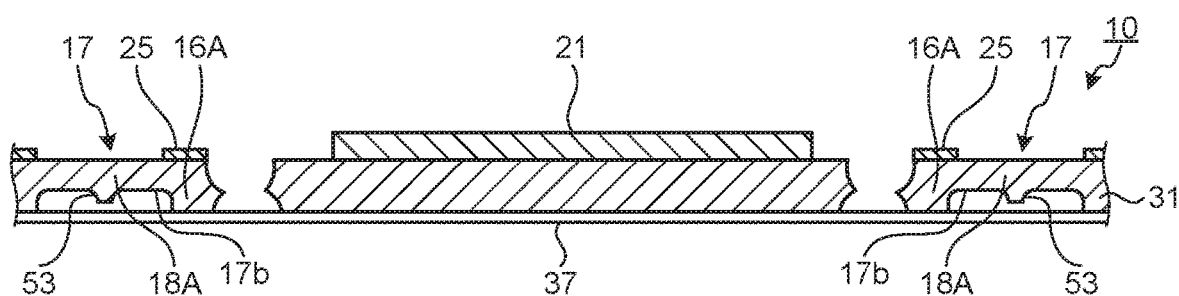
FIG. 8B is a sectional view illustrating the method of manufacturing the semiconductor device according to the first embodiment.

As illustrated in FIG. 8B, a semiconductor element 21 is mounted on the die pad 15 of the lead frame 10. In this case, the semiconductor element 21 is mounted and fixed on the die pad 15 with fixing material such as die bonding paste. The process illustrated in FIG. 8B is also referred to as "die attach".

Figure 8C:
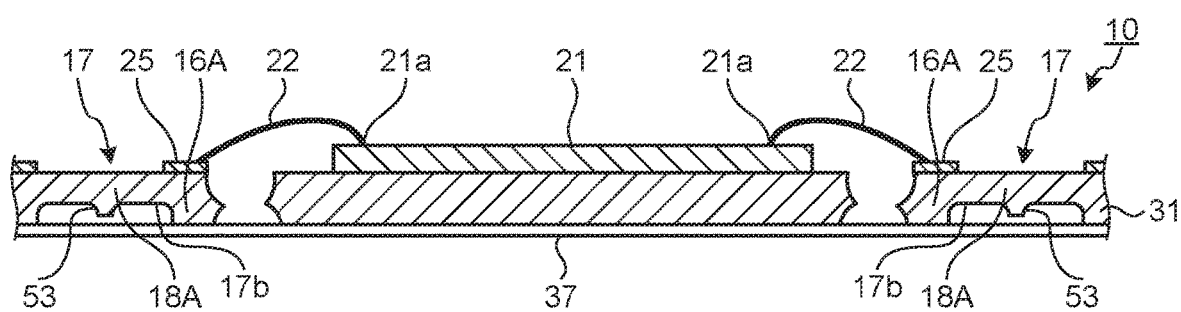
FIG. 8C is a sectional view illustrating the method of manufacturing the semiconductor device according to the first embodiment.

As illustrated in FIG. 8C, bonding wires 22 electrically connect terminals 21a on the semiconductor element 21 with the long lead portions 16A and the short lead portions 16B of the lead frame 10. The bonding wires 22 are an example of the connecting member. The process illustrated in FIG. 8C is also referred to as "wire bonding".

Figure 8D:
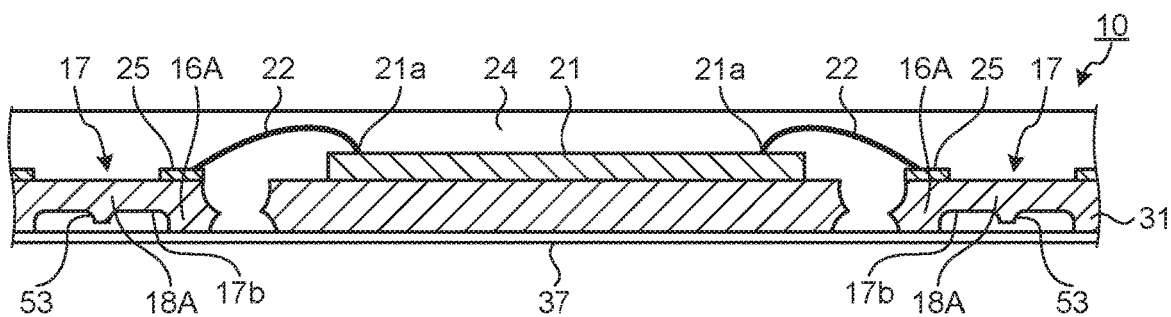
FIG. 8D is a sectional view illustrating the method of manufacturing the semiconductor device according to the first embodiment.

As illustrated in FIG. 8D, the die pad 15, the long lead portions 16A, the short lead portions 16B, the semiconductor element 21, and the bonding wires 22 are encapsulated with encapsulation resin 24. In this process, the back surface 17b of the connecting bar 17 is filled with the encapsulation resin 24, and accordingly, the raised portion 53 is covered with the encapsulation resin 24. The process illustrated in FIG. 8D is also referred to as "molding".

Figure 8E:
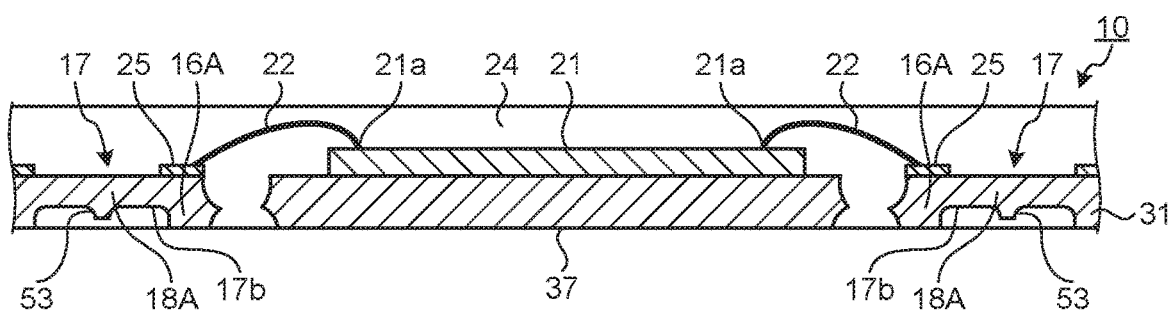
FIG. 8E is a sectional view illustrating the method of manufacturing the semiconductor device according to the first embodiment.

As illustrated in FIG. 8E, a back tape 37 is stripped from the back surface of the lead frame 10.

Figure 8F:
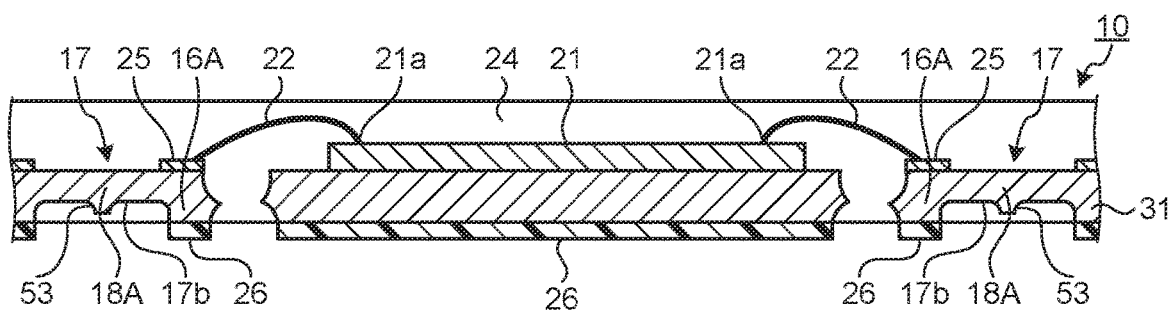
FIG. 8F is a sectional view illustrating the method of manufacturing the semiconductor device according to the first embodiment.

As illustrated in FIG. 8F, the solder-plating layer 26 is formed on portions exposed from the encapsulation resin 24 on the back surface of the lead frame 10. The solder-plating layer 26 is formed by, for example, electroplating. For example, the external terminals 16c of the long lead portions 16A and the short lead portions 16B are exposed from the encapsulation resin 24 on the back surface of the lead frame 10. Thus, the solder-plating layer 26 is formed on the external terminals 16c of the long lead portions 16A and the short lead portions 16B. Examples of the solder-plating layer 26 include an Sn plating layer, an Sn—Bi plating layer, and an Sn—Ag plating layer. The back surface of the die pad 15 opposite to the mount surface is also exposed from the encapsulation resin 24. Thus, the solder-plating layer 26 is also formed on the back surface of the die pad 15 opposite to the mount surface. However, the raised portion 53 is not exposed from the encapsulation resin 24 on the back surface of the lead frame 10. The solder-plating layer 26 is, therefore, not formed on the raised portion 53. The process illustrated in FIG. 8F is also referred to as "external plating process".

Figure 8G:
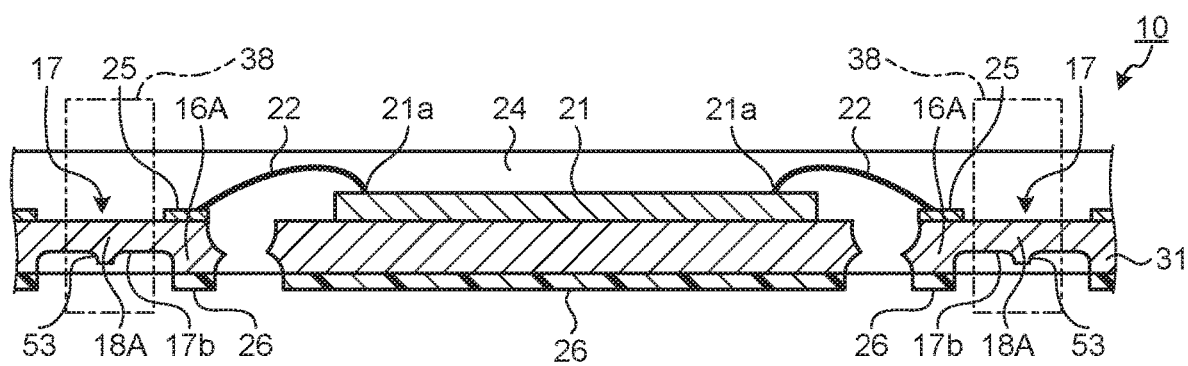
FIG. 8G is a sectional view illustrating the method of manufacturing the semiconductor device according to the first embodiment.

As illustrated in FIG. 8G, the connecting bar 17 and the encapsulation resin 24 between the adjacent lead frame elements 14 are cut off with a saw blade 38 to separate the lead frame 10 into lead frame elements 14. The process illustrated in FIG. 8G is also referred to as "sawing process".

Specifically, the saw blade 38 is, for example, a diamond blade and is moved along the direction in which the connecting bar 17 extends. In this manner, the saw blade 38 cuts off the connecting bar 17 and the encapsulation resin 24 between adjacent lead frame elements 14. In the first embodiment, the solder-plating layer 26 is not formed on the raised portion 53 on the back surface 17b of the connecting bar 17. When the connecting bar 17 is cut off with the saw blade 38, the raised portion 53, on which the solder-plating layer 26 is not formed, is cut off with the saw blade 38 and this can prevent adhesion of the solder-plating layer 26 to the edges of the saw blade 38. In this regard, adhesion of machining dust to the saw blade 38 can be prevented.

Figure 8H:
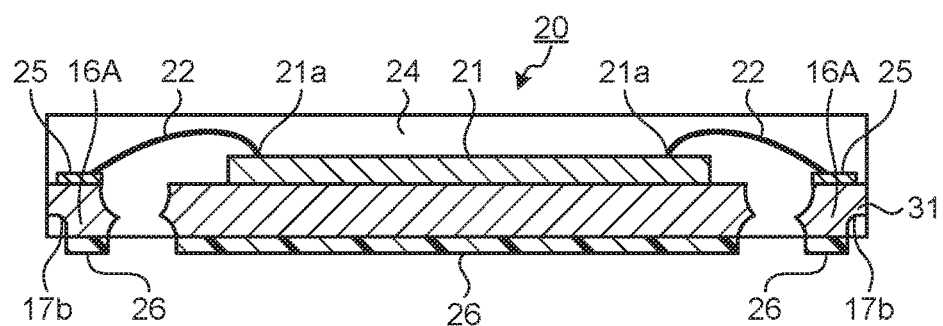
FIG. 8H is a sectional view illustrating the method of manufacturing the semiconductor device according to the first embodiment.

As illustrated in FIG. 8H, the semiconductor device 20 according to the first embodiment is manufactured.

The lead frame 10 according to the first embodiment includes a plurality of long lead portions 16A, a plurality of short lead portions 16B, a connecting bar 17, and a raised portion 53. The long lead portions 16A and the short lead portions 16B have a top surface (specifically, a surface on which an internal terminal 16a is disposed) and a back surface (specifically, a surface on which an external terminal 16c is disposed). The connecting bar 17 has a top surface 17a and a back surface 17b, and the long lead portions 16A and the short lead portions 16B are connected to the connecting bar 17. The raised portion 53 is formed on the back surface 17b of the connecting bar 17. The back surface 17b of the connecting bar 17 is positioned between the top surface (specifically, the surface on which the internal terminal 16a is disposed) and the back surface (specifically, the surface on which the external terminal 16c is disposed) of the long lead portions 16A and the short lead portions 16B. The tip of the raised portion 53 is positioned between the back surface (specifically, the surface on which the external terminal 16c is disposed) of the long lead portions 16A and the short lead portions 16B and the back surface 17b of the connecting bar 17.

With the configuration of the lead frame 10 above, the tip of the raised portion 53 can be recessed from a plane coplanar with the back surface (specifically, the surface on which the external terminal 16c is disposed) of the long lead portions 16A and the short lead portions 16B toward the back surface 17b of the connecting bar 17. The raised portion 53, therefore, is not exposed from the encapsulation resin 24 on the back surface of the lead frame 10 and the solder-plating layer 26 is not formed on the raised portion 53 after the external plating process. This configuration can prevent adhesion of the solder-plating layer 26 to the edges of the saw blade 38 when the connecting bar 17 is cut off in the sawing process. In this regard, the sawing process on the lead frame 10 can be achieved without adhesion of machining dust to the saw blade 38. In addition, although the connecting bar 17 has a half-etched back surface 17b, the raised portion 53 provides a certain thickness to the connecting bar 17 and can keep the stiffness of the connecting bar 17. Providing the raised portion 53 as described above can keep the stiffness of the connecting bar 17 and can prevent adhesion of machining dust to the saw blade 38 in the sawing process.

The raised portion 53 of the lead frame 10 linearly extends in a direction in which the connecting bar 17 extends.

This structure in the lead frame 10 can increase the stiffness of the entire connecting bar 17 in the direction in which the connecting bar 17 extends.

The connecting bar 17 of the lead frame 10 includes a plurality of long lead joints 18A each disposed between a corresponding pair of long lead portions 16A, and a plurality of short lead joints 18B each disposed between a corresponding pair of short lead portions 16B. The raised portion 53 is formed at regions corresponding to the long lead joints 18A and the short lead joints 18B on the back surface 17b of the connecting bar 17.

This structure in the lead frame 10 can increase the stiffness of the long lead joints 18A and the short lead joints 18B on which stress is concentrated in the connecting bar 17.

Second Embodiment

Described next is a second embodiment of the present disclosure. A lead frame 10A according to the second embodiment has the same configuration as the lead frame 10 according to the first embodiment except for the disposition of raised portions 53 on the long lead joints 18A and the short lead joints 18B. In the second embodiment, components similar to those in the first embodiment are similarly numbered and the description thereof will not be repeated.

Figure 9A:
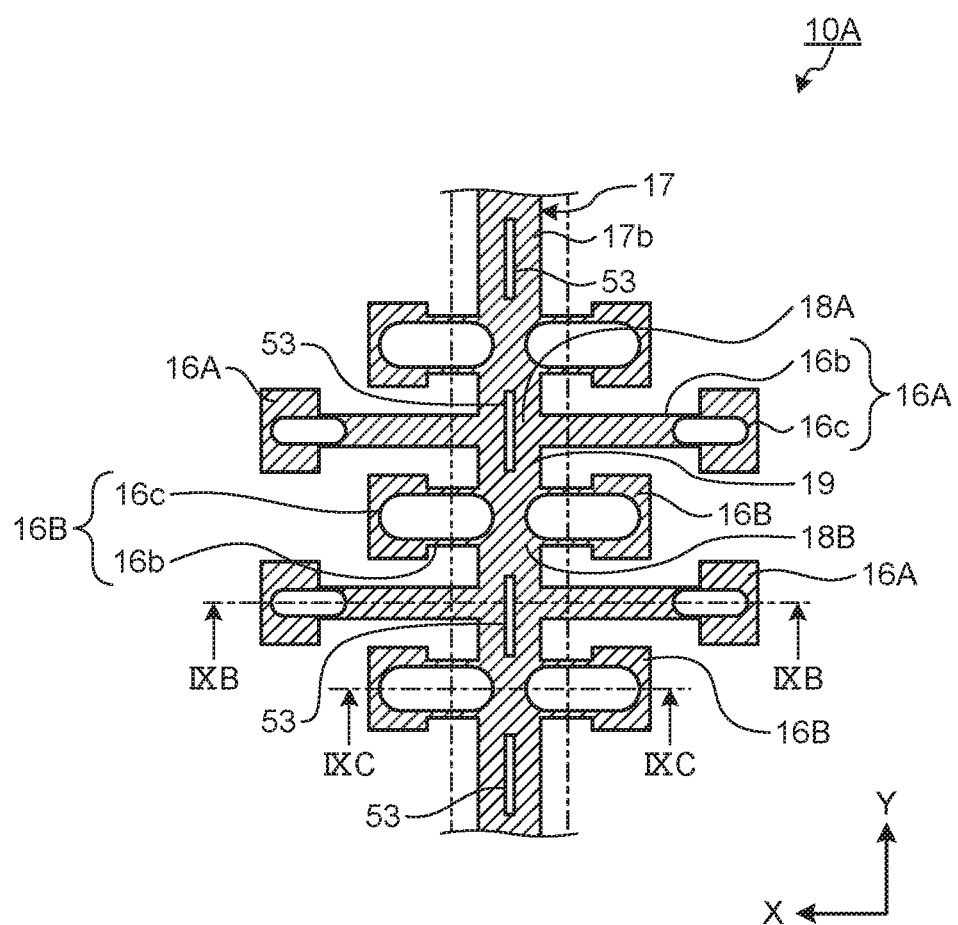
FIG. 9A is a partially enlarged plan view of a back surface of a connecting bar according to a second embodiment of the present disclosure.
Figure 9B:
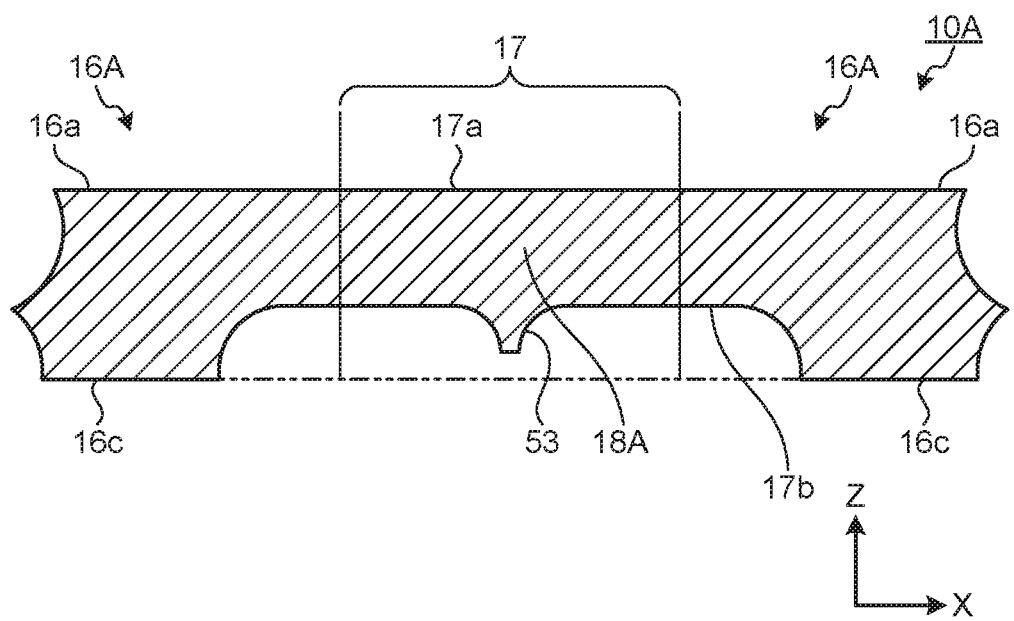
FIG. 9B is a sectional view of a long lead joint of the connecting bar according to the second embodiment.
Figure 9C:
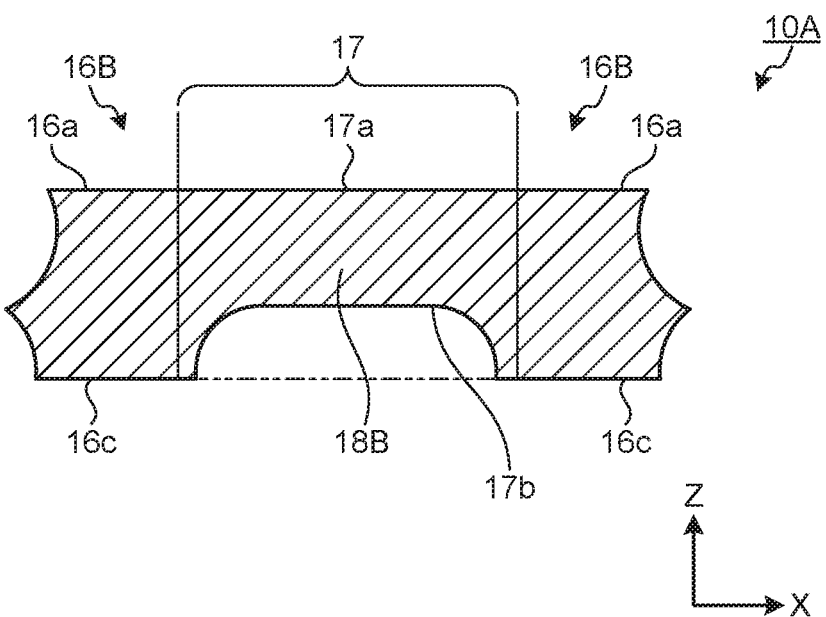
FIG. 9C is a sectional view of a short lead joint of the connecting bar according to the second embodiment.

FIG. 9A is a partially enlarged plan view of a back surface of a connecting bar 17 according to the second embodiment. FIG. 9B is a sectional view of a long lead joint 18A of the connecting bar 17 according to the second embodiment. FIG. 9C is a sectional view of a short lead joint 18B of the connecting bar 17 according to the second embodiment. FIG. 9B is a sectional view taken along line IXB-IXB in FIG. 9A and FIG. 9C is a sectional view taken along line IXC-IXC in FIG. 9A.

As illustrated in FIG. 9A, raised portions 53 having an island-like shape are disposed in a direction in which the connecting bar 17 extends. In other words, as illustrated in FIG. 9B, the raised portions 53 are formed at regions corresponding to the long lead joints 18A on the back surface 17b of the connecting bar 17. However, as illustrated in FIG. 9C, the raised portions 53 are not formed at regions corresponding to the short lead joints 18B on the back surface 17b of the connecting bar 17.

The lead frame 10A according to the second embodiment can increase the stiffness of the long lead joints 18A on which stress is most concentrated in the connecting bar 17.

Third Embodiment

Described next is a third embodiment of the present disclosure. A lead frame 10B according to the third embodiment has the same configuration as the lead frame 10 according to the first embodiment except that the long lead portions 16A are eliminated. In the third embodiment, components similar to those in the first embodiment are similarly numbered and the description thereof will not be repeated.

Figure 10:
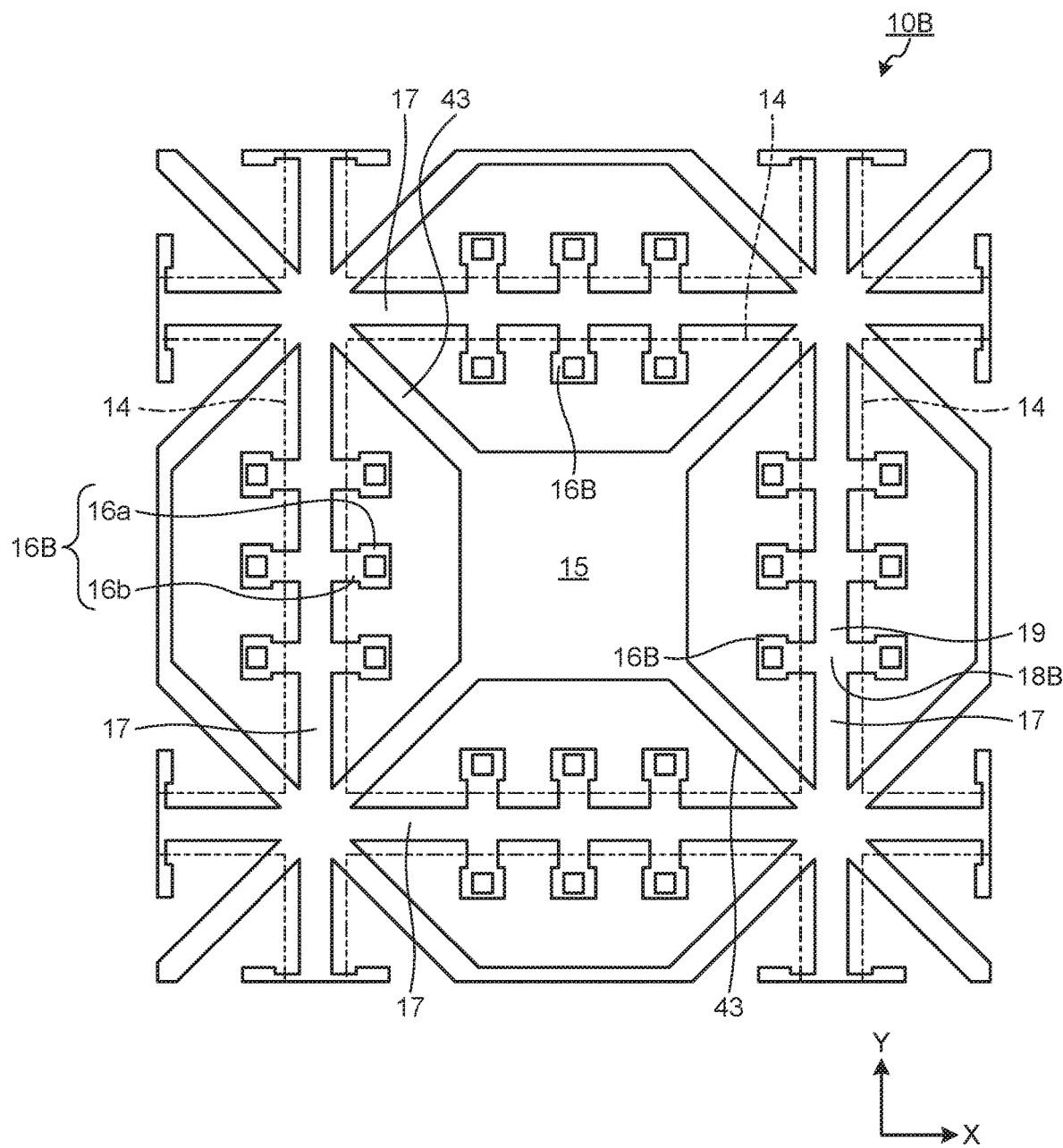
FIG. 10 is a plan view of a top surface of a lead frame according to a third embodiment of the present disclosure.
Figure 11:
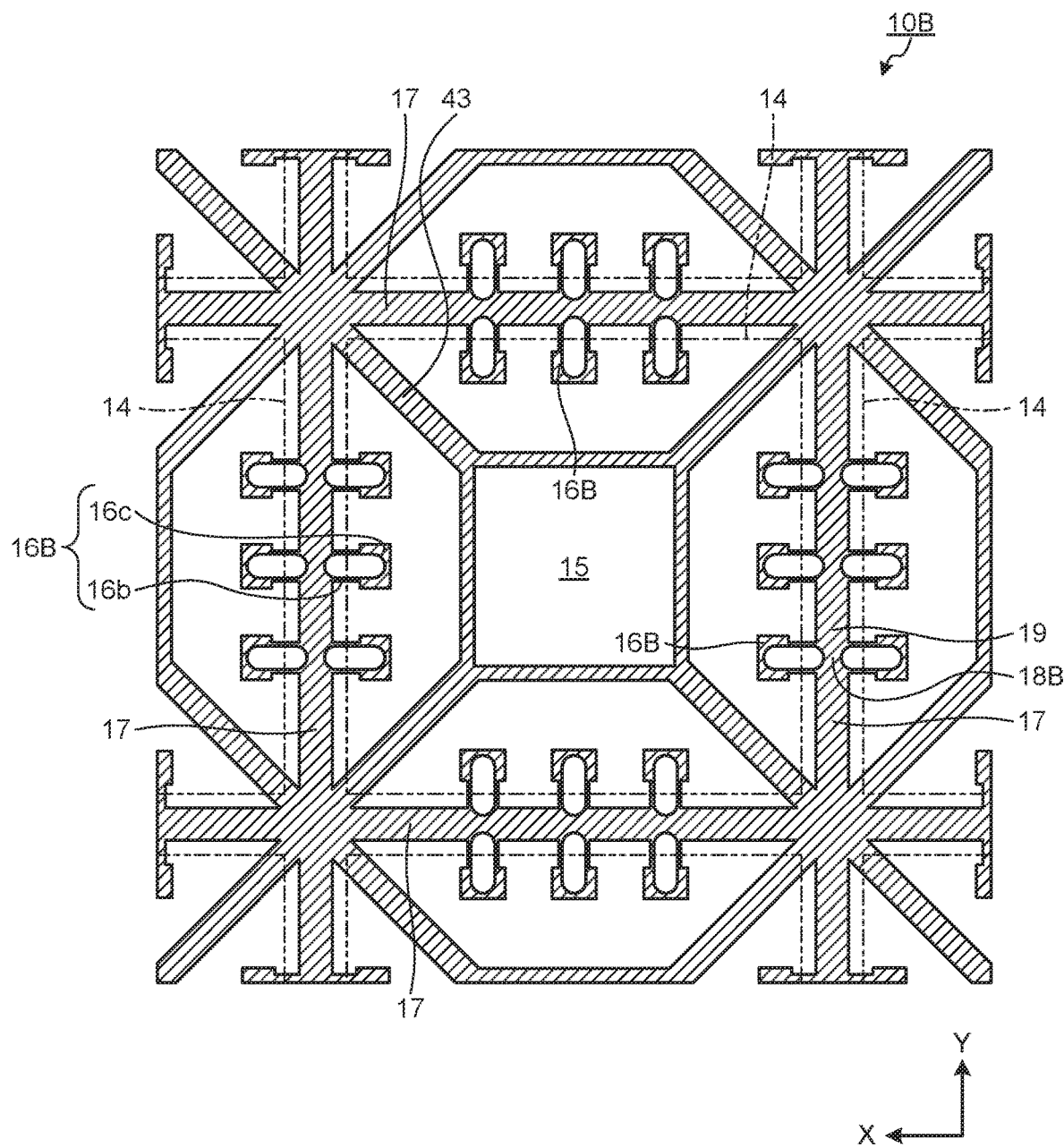
FIG. 11 is a plan view of a back surface of the lead frame according to the third embodiment.
Figure 12:
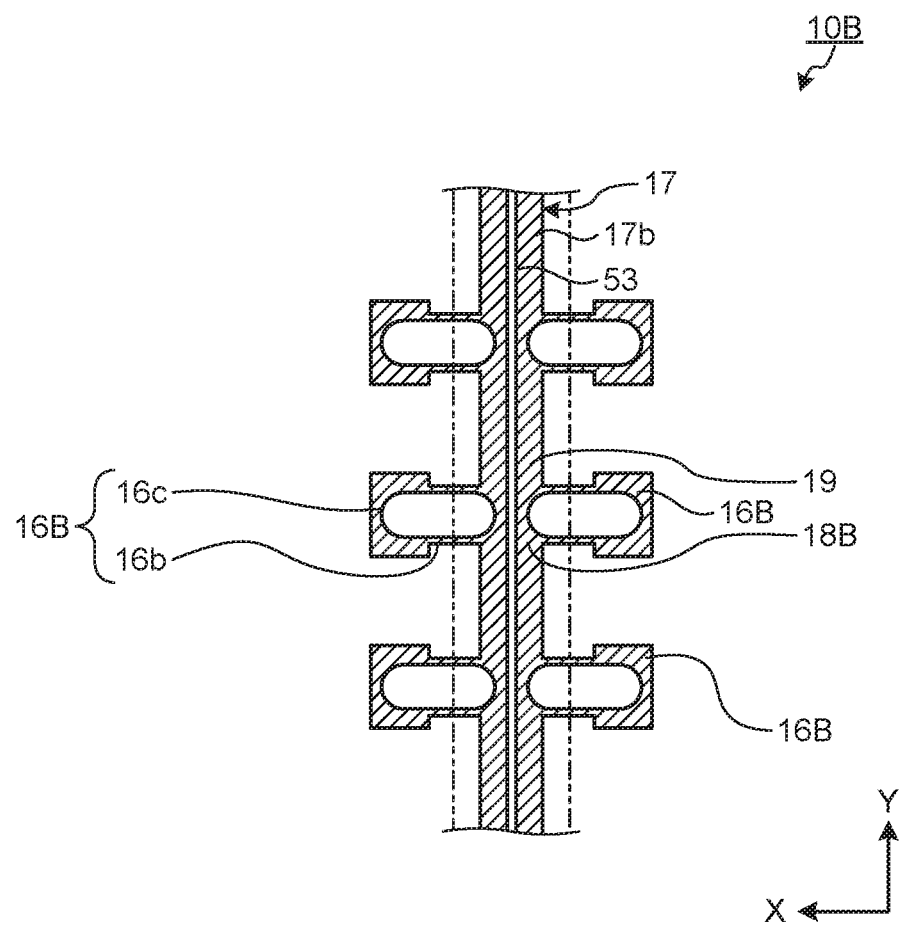
FIG. 12 is a partially enlarged plan view of a back surface of a connecting bar according to the third embodiment.

FIG. 10 is a plan view of a top surface of the lead frame 10B according to the third embodiment. FIG. 11 is a plan view of a back surface of the lead frame 10B according to the third embodiment. FIG. 12 is a partially enlarged plan view of a back surface of a connecting bar 17 according to the third embodiment.

The lead frame 10B illustrated in FIGS. 10 and 11 includes lead frame elements 14 each including a die pad 15 and a plurality of short lead portions 16B disposed around the die pad 15. In other words, the lead frame 10B differs from the lead frame 10 according to the first embodiment in that the long lead portions 16A (see FIGS. 1 and 2) are eliminated. The short lead portions 16B are an example of the lead portion. In the lead frame 10B, the middle portions 19 are each disposed between adjacent short lead joints 18B.

The lead frame 10B has a raised portion 53 on the back surface 17b of the connecting bar 17. The tip of the raised portion 53 is positioned between the back surface of the short lead portions 16B and the back surface 17b of the connecting bar 17. Providing the raised portion 53 as described above can keep the stiffness of the connecting bars 17 and can prevent adhesion of machining dust to the saw blade 38 in the sawing process.

As illustrated in FIG. 12, the raised portion 53 linearly extends in a direction in which the connecting bar 17 extends. This configuration can increase the stiffness of the entire connecting bar 17 in the direction in which the connecting bar 17 extends.

Fourth Embodiment

Described next is a fourth embodiment of the present disclosure. A lead frame 10C according to the fourth embodiment has the same configuration as the lead frame 10B according to the third embodiment except for the disposition of raised portions 53. In the fourth embodiment, components similar to those in the third embodiment are similarly numbered and the description thereof will not be repeated.

Figure 13:
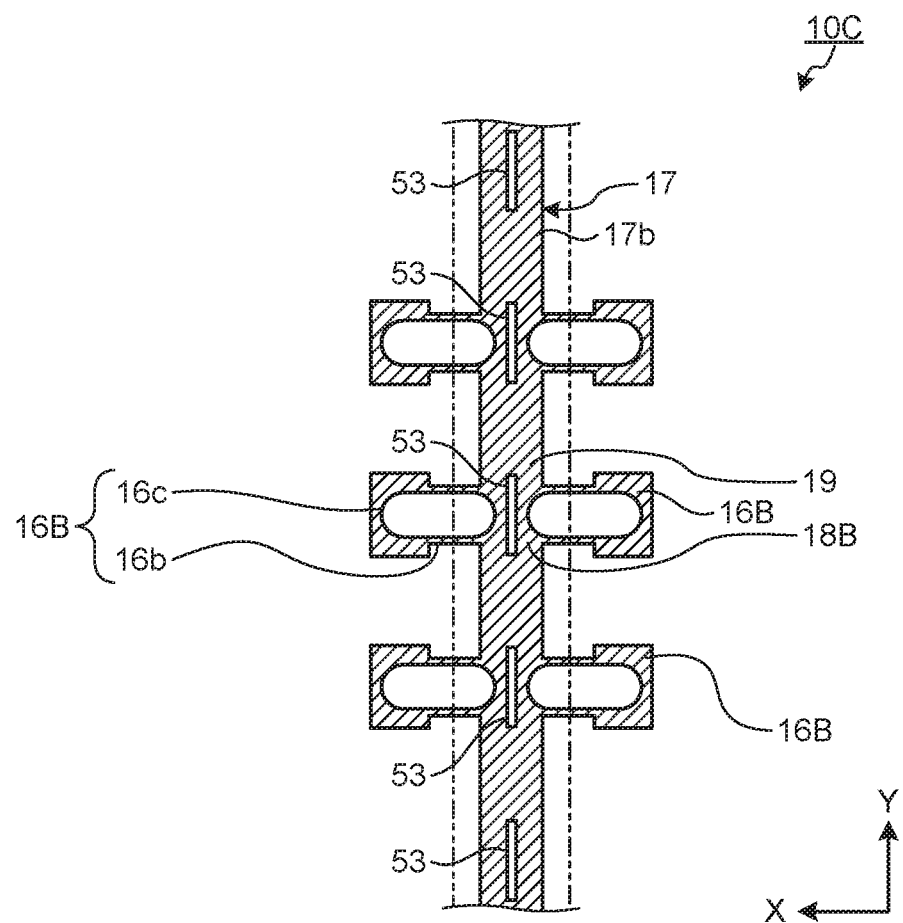
FIG. 13 is a partially enlarged plan view of a back surface of a connecting bar according to a fourth embodiment of the present disclosure.

FIG. 13 is a partially enlarged plan view of a back surface of a connecting bar 17 according to the fourth embodiment.

As illustrated in FIG. 13, the lead frame 10C has raised portions 53 having an island-like shape that are disposed in a direction in which the connecting bar 17 extends. In other words, the raised portions 53 are formed at regions corresponding to the short lead joints 18B on the back surface 17b of the connecting bar 17. However, the raised portions 53 are not formed at regions corresponding to the middle portions 19 on the back surface 17b of the connecting bar 17.

The lead frame 10C according to the fourth embodiment can increase the stiffness of the short lead joints 18B on which stress is concentrated in the connecting bar 17.

Fifth Embodiment

Described next is a fifth embodiment of the present disclosure. A lead frame 10D according to the fifth embodiment has the same configuration as the lead frame 10B according to the third embodiment except for the disposition of raised portions 53. In the fifth embodiment, components similar to those in the third embodiment are similarly numbered and the description thereof will not be repeated.

Figure 14:
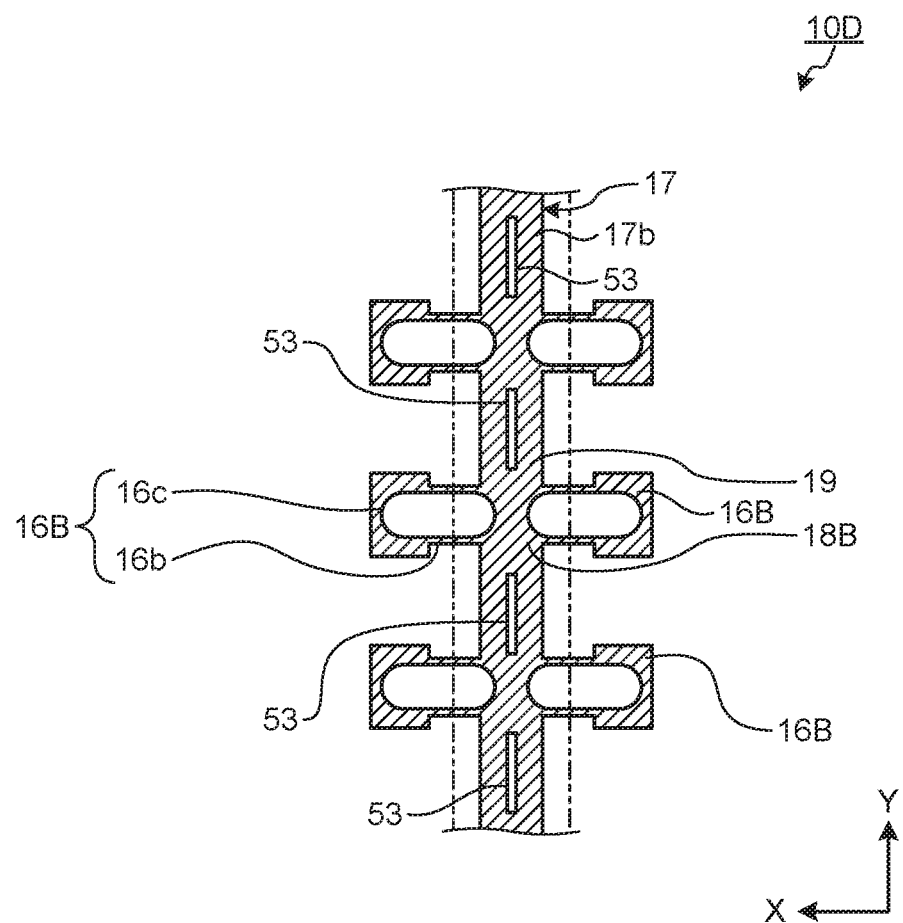
FIG. 14 is a partially enlarged plan view of a back surface of a connecting bar according to a fifth embodiment of the present disclosure.

FIG. 14 is a partially enlarged plan view of a back surface of a connecting bar 17 according to the fifth embodiment.

As illustrated in FIG. 14, the lead frame 10D has raised portions 53 having an island-like shape that are disposed in a direction in which the connecting bar 17 extends. In other words, the raised portions 53 are formed at regions corresponding to the middle portions 19 on the back surface 17b of the connecting bar 17. However, the raised portions 53 are not formed at regions corresponding to the short lead joints 18B on the back surface 17b of the connecting bar 17.

The lead frame 10D according to the fifth embodiment can increase the stiffness of the connecting bar 17 if the connecting bar 17 is so narrow that the raised portions 53 cannot be formed at regions corresponding to the short lead joints 18B on the back surface 17b of the connecting bar 17.

Sixth Embodiment

Configuration of Lead Frame

Figure 15:
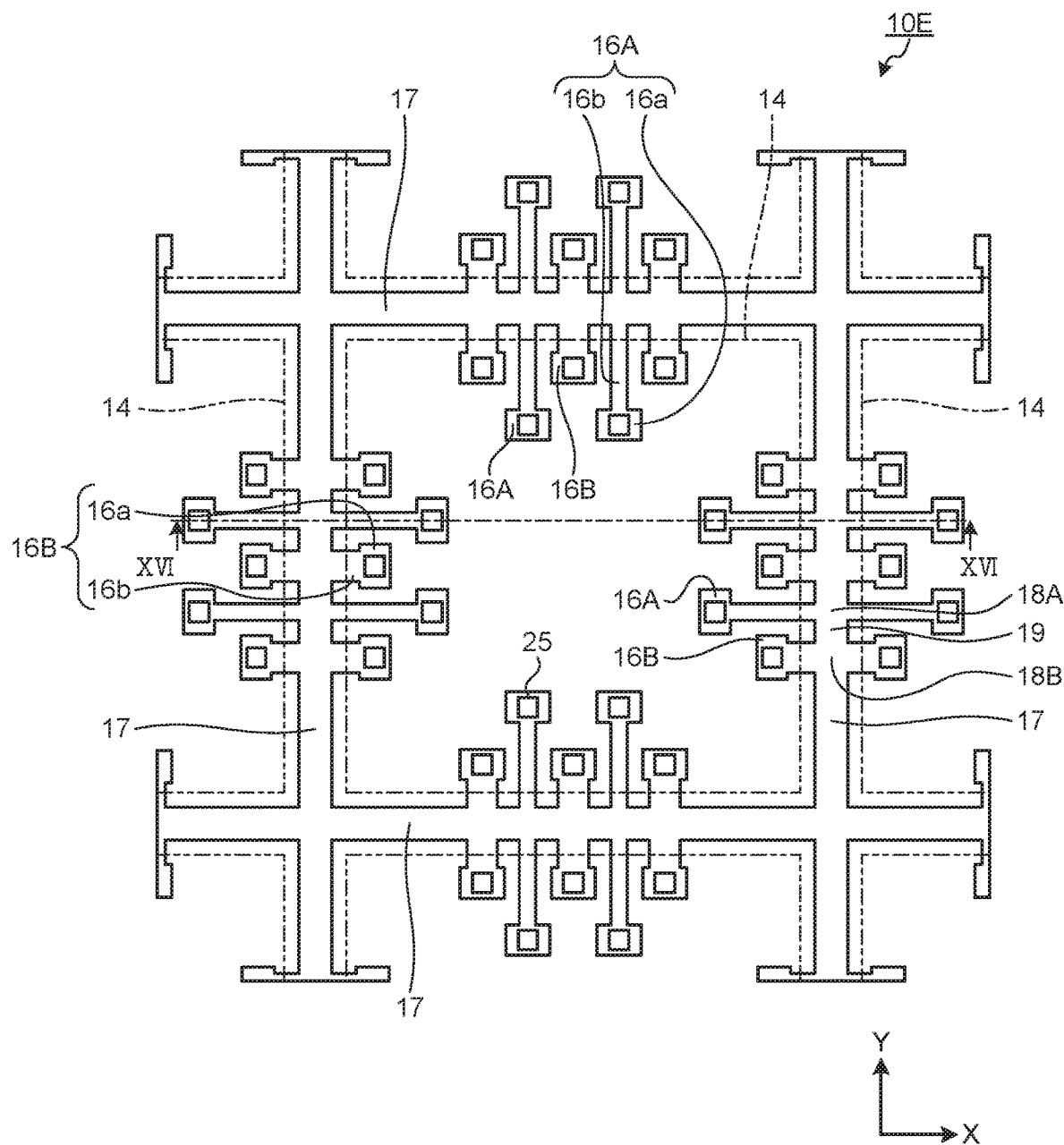
FIG. 15 is a plan view of a top surface of a lead frame according to a sixth embodiment of the present disclosure.
Figure 16:
FIG. 16 is a sectional view taken along line XVI-XVI in FIG. 15.

FIG. 15 is a plan view of a top surface of a lead frame 10E according to a sixth embodiment of the present disclosure. FIG. 16 is a sectional view taken along line XVI-XVI in FIG. 15. The lead frame 10E according to the sixth embodiment has the same configuration as the lead frame 10 according to the first embodiment except that the die pad 15 and the hanging leads 43 are eliminated. In the sixth embodiment, components similar to those in the first embodiment are similarly numbered and the description thereof will not be repeated.

The lead frame 10E illustrated in FIGS. 15 and 16 includes lead frame elements 14 each including a plurality of long lead portions 16A and a plurality of short lead portions 16B. In other words, the lead frame 10E differs from the lead frame 10 according to the first embodiment in that the die pad 15 and the hanging leads 43 are eliminated.

Configuration of Semiconductor Device

Figure 17:
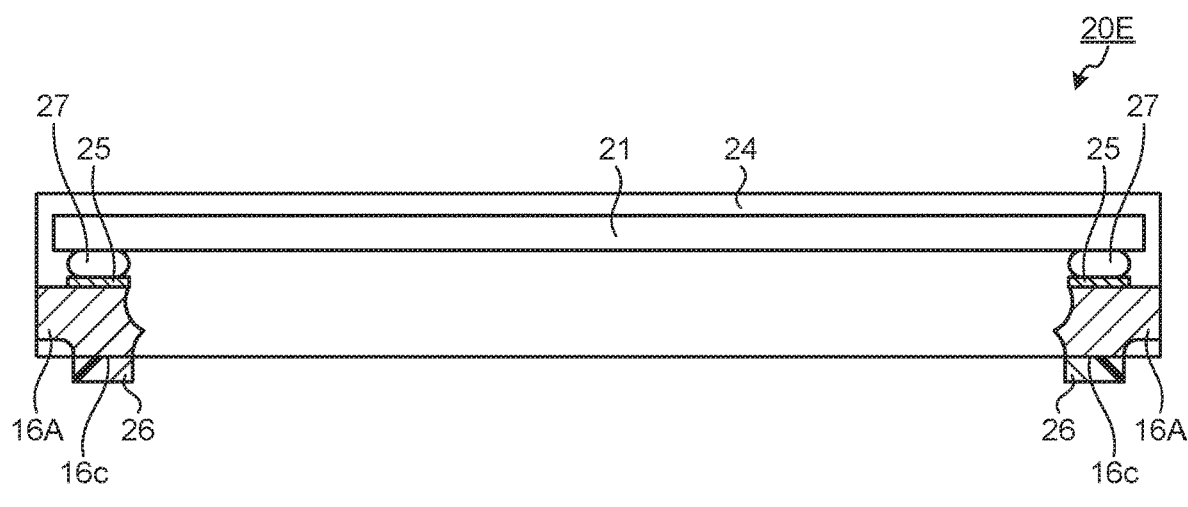
FIG. 17 is a side sectional view illustrating an example configuration of a semiconductor device made with the lead frame according to the sixth embodiment.

Described next is a semiconductor device 20E made with the lead frame 10E according to the sixth embodiment with reference to FIG. 17. FIG. 17 a side sectional view illustrating an example configuration of the semiconductor device 20E made with the lead frame 10E according to the sixth embodiment.

The semiconductor device 20E illustrated in FIG. 17 includes the long lead portions 16A, the short lead portions 16B, and the semiconductor element 21 mounted on the long lead portions 16A and the short lead portions 16B. The semiconductor device 20E includes bumps 27 that electrically connect the long lead portions 16A and the short lead portions 16B with the semiconductor element 21. The long lead portions 16A, the short lead portions 16B, the semiconductor element 21, and the bumps 27 are encapsulated with the encapsulation resin 24.

The semiconductor element 21 is, for example, an integrated circuit, a large-scale integrated circuit, a transistor, a thyristor, or a diode. The semiconductor element 21 is fixed on the long lead portions 16A and the short lead portions 16B with the bumps 27.

The bumps 27 are, for example, solder. The upper surface of the bumps 27 is connected to the terminals on the semiconductor element 21 and the lower surface thereof is connected to the long lead portions 16A and the short lead portions 16B.

The encapsulation resin 24 may be, for example, epoxy resin or silicone resin. The external terminals 16c of the long lead portions 16A and the short lead portions 16B are exposed from the encapsulation resin 24 on the back surface of the semiconductor device 20E. The external terminals 16c of the long lead portions 16A and the short lead portions 16B are covered with solder-plating layer 26 that is the external layer of the semiconductor device 20E.

The lead frame 10E has the raised portion 53 on the back surface 17b of the connecting bar 17. The tip of the raised portion 53 is positioned between the back surface of the long lead portions 16A and the short lead portions 16B and the back surface 17b of the connecting bar 17. Providing the raised portion 53 as described above can keep the stiffness of the connecting bars 17 and can prevent adhesion of machining dust to the saw blade 38 in the sawing process.

According to an embodiment of the present disclosure, a sawing process on the lead frame can be achieved without adhesion of machining dust to a saw blade.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Note

A method of manufacturing a lead frame, the method comprising:
forming a resist layer on a metal plate;
etching the metal plate with the resist layer being used as a mask to form, in the metal plate, a lead portion having a first surface and a second surface, a connecting bar that has a first surface and a second surface and to which the lead portion is connected, and a raised portion provided on the first surface of the connecting bar; and
removing the resist layer from the metal plate, wherein
the first surface of the connecting bar is positioned between the first surface and the second surface of the lead portion, and
the raised portion has a tip that is positioned between the first surface of the lead portion and the first surface of the connecting bar.

What is claimed is:

1. A lead frame comprising:
a lead portion having a first surface and a second surface;
a connecting bar that has a first surface and a second surface and to which the lead portion is connected; and
a raised portion provided on the first surface of the connecting bar, wherein
the first surface of the connecting bar is positioned between the first surface and the second surface of the lead portion, and
the raised portion has a tip that is recessed from a plane coplanar with the first surface of the lead portion toward the first surface of the connecting bar.

2. The lead frame of claim 1, further comprising a die pad having a mount surface on which a semiconductor element is mounted.

3. The lead frame of claim 1, further comprising a plurality of lead frame elements each including a die pad having a mount surface on which a semiconductor element is mounted and a plurality of the lead portions disposed around the die pad.

4. The lead frame of claim 1, wherein the raised portion linearly extends in a direction in which the connecting bar extends.

5. The lead frame of claim 4, wherein
the lead portion includes a plurality of relatively long lead portions and a plurality of relatively short lead portions,
the connecting bar extends in a direction orthogonal to a longitudinal direction of the long lead portions and the short lead portions and connects a corresponding pair of the long lead portions and a corresponding pair of the short lead portions,
the connecting bar includes
a plurality of long lead joints each disposed between a corresponding pair of the long lead portions and
a plurality of short lead joints each disposed between a corresponding pair of the short lead portions, and
the raised portion is formed at regions on the first surface of the connecting bar, the regions corresponding to the long lead joints and the short lead joints.

6. The lead frame of claim 1, wherein the raised portion includes a plurality of raised portions having an island-like shape and disposed in a direction in which the connecting bar extends.

7. The lead frame of claim 6, wherein
the lead portion includes a plurality of relatively long lead portions and a plurality of relatively short lead portions,
the connecting bar extends in a direction orthogonal to a longitudinal direction of the long lead portions and the short lead portions and connects a corresponding pair of the long lead portions and a corresponding pair of the short lead portions,
the connecting bar includes
a plurality of long lead joints each disposed between a corresponding pair of the long lead portions and
a plurality of short lead joints each disposed between a corresponding pair of the short lead portions, and
the raised portions are formed at regions on the first surface of the connecting bar, the regions corresponding to the long lead joints.

8. The lead frame of claim 1, wherein
the first surface of the lead portion is provided with an external terminal connected to an external circuit board, and
the second surface of the lead portion is provided with an internal terminal connected to a connecting member that electrically connects a semiconductor element with the lead portion.

* * * * *